(12) United States Patent
Chi et al.

(10) Patent No.: US 12,252,640 B2
(45) Date of Patent: Mar. 18, 2025

(54) PHOSPHORS BASED ON CARBENE METAL COMPLEX

(71) Applicant: CITY UNIVERSITY OF HONG KONG, Kowloon (HK)

(72) Inventors: Yun Chi, Kowloon (HK); Yi Yuan, Kowloon (HK); Caifa You, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 670 days.

(21) Appl. No.: 17/465,604

(22) Filed: Sep. 2, 2021

(65) Prior Publication Data

US 2023/0098697 A1    Mar. 30, 2023

Related U.S. Application Data

(63) Continuation-in-part of application No. 17/405,802, filed on Aug. 18, 2021.

(51) Int. Cl.
| | |
|---|---|
| *C09K 11/06* | (2006.01) |
| *C07F 15/00* | (2006.01) |
| *H01L 51/00* | (2006.01) |
| *H10K 85/30* | (2023.01) |
| *H10K 50/11* | (2023.01) |
| *H10K 101/10* | (2023.01) |

(52) U.S. Cl.
CPC .......... *C09K 11/06* (2013.01); *C07F 15/0033* (2013.01); *H10K 85/342* (2023.02); *C09K 2211/1007* (2013.01); *C09K 2211/1044* (2013.01); *C09K 2211/185* (2013.01); *H10K 50/11* (2023.02); *H10K 2101/10* (2023.02)

(58) Field of Classification Search
CPC .............. C09K 11/06; C09K 2211/185; C09K 2211/1044; C09K 2211/1007; C07F 15/0033; H01L 51/0085; H01L 51/5016
See application file for complete search history.

(56) References Cited

U.S. PATENT DOCUMENTS

2005/0258742 A1    11/2005  Tsai et al.
2005/0260447 A1    11/2005  Brooks et al.

FOREIGN PATENT DOCUMENTS

WO    WO-2015150203 A1  *  10/2015  .......... C07F 15/0033

* cited by examiner

*Primary Examiner* — Robert D Harlan
(74) *Attorney, Agent, or Firm* — Conley Rose, P.C.; Michael W. Piper; Andrew M. Metrailer

(57) ABSTRACT

This invention relates to an iridium metal complex. The iridium metal complex comprises no more than three 1,3-dihydro-2H-benzo[d]imidazol-2-ylidene based carbene cyclometalate ligands. The iridium metal complex provides a blue emission. This is useful for organic light emitting diode (OLED) components where blue emitters have trailed behind the advances 5 of red and green emitters.

14 Claims, No Drawings

PHOSPHORS BASED ON CARBENE METAL COMPLEX

CROSS-REFERENCE TO RELATED APPLICATIONS

The present application claims priority to U.S. application Ser. No. 17/405,802 filed with the United States Patent and Trademark Office on Aug. 18, 2021, and entitled, "PHOSPHORS BASED ON CARBENE METAL COMPLEX", which is incorporated herein by reference in its entirety for all purposes.

This invention relates to a metal complex. The metal complex may comprise at least one ligand that is a 1,3-dihydro-2H-benzo[d]imidazol-2-ylidene based carbene cyclometalate. The complex is particularly but not exclusively an iridium complex. The complexes of this invention may be utilised as a blue-emitting component within an organic light-emitting diode (OLED). As such, the present invention also relates to OLEDs comprising the metal complex, particularly the iridium metal complex.

BACKGROUND

Organic light-emitting diodes (OLED) have already become a very important technology of the 21st century. Full-color OLED displays demand utilization of efficient and stable OLED emitters with all three elementary colors, namely: red, green and blue (RGB). Despite remarkable progression within the field there is still high demand within both the academic and industrial sectors for potential RGB emitters within an OLED showing improved performance. A key requirement for OLED emitters is their capability to harvest both the electrically generated singlet and triplet excitons for lower power consumption and better performance. Meanwhile, the OLED should achieve longer operation lifespans, which could be, in part, solved by using more robust and durable emitters, together with achievement of balanced carrier transports within the devices. Currently, both red and green emitters have passed all stringent industrial assessments. However, blue emitters remain a challenge for industrialization.

Even though a blue emitter has not yet been produced that meets the industrial assessments, OLED display panels have already become a standard component of high-end smartphones sold in commercial markets. Therefore, there is a strong drive to develop blue-emitting materials which to this point has lagged behind the development of red and green emitters and has become the grand challenge for the whole OLED industry.

Both the red and green OLEDs have been well developed and employed for commercial processes in recent years. Blue emitters within an OLED suffer from the problem of having a higher emission energy. Consequently, the associated devices tended to possess an inferior emission efficiency and poor stability during operation which was caused by facile thermal population to the upper lying quenching states and longer radiative lifetime of emitters. Therefore, there is a necessity to invent robust blue emitters, which avoid thermal population to the upper lying quenching states and which have shortened radiative lifetime, so that thermally induced decomposition can be suppressed.

Currently within the field of OLEDs there are two classes of emitters, namely: thermally activated delayed fluorescence (TADF) emitters and phosphorescent emitters. These materials are competing for the future commercial applications. One reason is that both emitters can provide very high internal quantum efficiency of 100% based on theoretical predictions. Hence, those with better stability and reduced radiative lifetime upon excitation will be more suitable for future commercial applications.

Iridium metal complexes comprising 1,3-dihydro-2H-benzo[d]imidazol-2-ylidene based carbene cyclometalates have been proposed as possible blue phosphors for OLED devices. A number of patents have been filed during the last twenty years for this class of OLED phosphors.

US20050260447 "Cyclometallated iridium carbene complexes for use as hosts" discloses such 1,3-dihydro-2H-benzo[d]imidazol-2-ylidene based carbene cyclometalates within an OLED structure. Exemplary, structures taken from this disclosure are provided below.

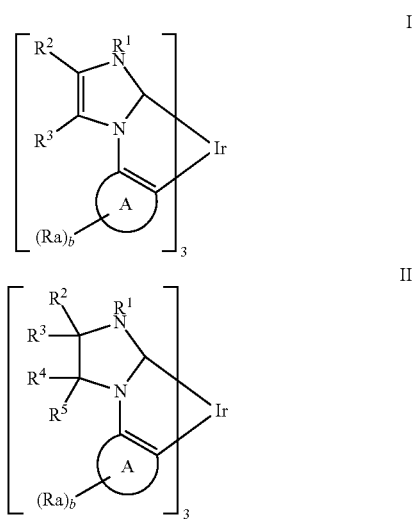

Similarly, US20050258742 "Carbene containing metal complexes as OLEDs" discloses 1,3-dihydro-2H-benzo[d]imidazol-2-ylidene based carbene cyclometalates along with other cyclometalates chelated to a diverse range of ligands.

WO 2006018292 "Transition metal carbene complexes embedded in polymer matrices for use in organic light-emitting diodes (OLEDs)" discloses N,N-disubstituted-1,3-dihydro-2H-benzo[d]imidazol-2-ylidene based cyclometalates.

As suggested by the title, "Metal complexes, comprising carbene ligands having an o-substituted non-cyclometalated aryl group and their use in organic light emitting diodes", WO 2015150203 discloses carbene ligands for use in OLED emitters which bear a further aryl group that is non-cyclometalated. Thus, the carbene ligands possess two aryl rings, one cyclometalated and one that is not. WO 2015150203 also considers the introduction of a single trifluoromethyl but no information on photophysical properties for these chelate and iridium(III) metal phosphors has been given.

Despite the above disclosures of 1,3-dihydro-2H-benzo[d]imidazol-2-ylidene based carbene cyclometalates there is still a need for improved blue emitters for use in OLED materials and devices.

Therefore, in certain embodiments, the present application aims to provide improved blue phosphors, which render increasing photoluminescence quantum yield, for example to a value higher than 85%. In certain embodiments, the present application aims to provide phosphorescence peak max. located in the region 450-485 nm. In certain embodiments, the present application further aims to provide radiative lifetime lower than 1 microsecond. In certain embodiments, the present application also aims to provide a true blue color with Commission Internationale de l'enclairage coordinates, CIE(y)-corrected current efficiency maximum (cd·A$^{-1}$/y)≥220, or CIE(y)=0.16 and below. Generally, these features will provide high-performance OLED devices.

Hence, the newly proposed blue emitters of the present invention aim to display an improved emission efficiency as well as better stability against unwanted degradation of emitters during device operation. Moreover, in certain embodiments the present invention aims to optimize their photophysical and chemical properties to obtain Ir(III) emitters with blue photoluminescence (PL) with emission peak max. around 450-485 nm and/or PLQY>60%. Furthermore, in certain embodiments, the present application aims to provide an emitter with radiative emission lifetime (τ)<2 microseconds. Finally, the novel OLED materials disclosed in this specification may find application in fabrication of durable, blue OLEDs suitable for various technological applications.

BRIEF SUMMARY OF THE DISCLOSURE

The metal complexes disclosed herein are true-blue emitters with very high emission efficiencies and short radiative lifetimes in solution, doped PMMA matrix and selected host materials of OLED devices. A shorter radiative lifetime may offer extended device stability which is urgently needed for blue emitters.

In accordance with the present invention there is provided a metal complex according to formula (I):

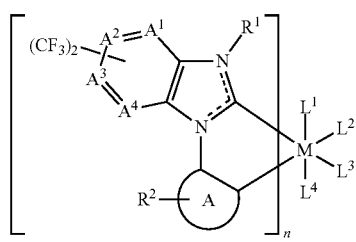

I wherein:
M is a transition metal;
n is selected from 1, 2 or 3;
$L^1$, $L^2$, $L^3$ and $L^4$ each independently represent an optionally present monodentate ligand or two adjacent $L^1$, $L^2$, $L^3$ and $L^4$ may represent an optionally present bidentate ligand;
A represents a $C_{6-10}$ aryl ring or a 5 to 10 membered heteroaryl ring;
two of $A^1$, $A^2$, $A^3$ and $A^4$ are C and are substituted by the strong electron withdrawing $CF_3$ groups indicated in the formula and the remaining two of $A^1$, $A^2$, $A^3$ and $A^4$ may be independently selected from CH or N;
$R^1$ is selected from the group consisting of: $C_{1-6}$ alkyl, $C_{2-6}$ alkylether, $C_{1-6}$ alkoxy, $C_{1-6}$ fluoroalkyl, $C_{2-6}$ alkenyl, $C_{2-6}$ alkynyl, substituted or unsubstituted $C_{3-8}$ cycloalkyl, substituted or unsubstituted $C_{3-8}$ cycloalkenyl, substituted or unsubstituted 3 to 8 membered heterocycloalkyl, substituted or unsubstituted 3 to 8 membered heterocycloalkenyl, substituted or unsubstituted $C_{6-10}$ aryl, substituted or unsubstituted $C_{7-11}$ aralkyl, substituted or unsubstituted heteroaryl having 5 to 10 carbon atoms and/or heteroatoms, and substituted or unsubstituted heteroaralkyl having 6 to 11 carbon atoms and/or heteroatoms; and
$R^2$ is H, deuterium, fluorine, cyano, $C_{1-6}$ alkyl, $C_{1-6}$ alkoxy, $C_{1-6}$ fluoroalkyl, substituted or unsubstituted $C_{6-10}$ aryl, or substituted or unsubstituted heteroaryl having 5 to 10 carbon atoms and/or heteroatoms.

In embodiments M is selected from iridium, gold, platinum, palladium, rhodium, and ruthenium. Preferably, M is selected from iridium, gold and platinum. In embodiments M is selected from Ir(III), Rh(III), Pt(II), Pd(II), Au(III), Os(II) or Ru(II).

In embodiments A represents a phenyl ring or a pyridyl ring.

In embodiments $A^1$ and $A^3$ are each independently selected from C or CH and $A^2$ and $A^4$ are each independently selected from C, CH or N, provided that two of $A^1$, $A^2$, $A^3$ and/or $A^4$ are C and they are substituted by the $CF_3$ groups indicated in the formula.

In embodiments $R^1$ is selected from the group consisting of: $C_{1-6}$ alkyl, $C_{2-6}$ alkylether, $C_{1-6}$ alkoxy, $C_{1-6}$ fluoroalkyl, substituted or unsubstituted $C_{7-11}$ aralkyl, and substituted or unsubstituted $C_{6-10}$ aryl.

In embodiments $R^1$ is selected from the group consisting of: methyl, ethyl, propyl, butyl (optionally tert-butyl)phenyl, or benzyl.

In embodiments $R^2$ is H, deuterium, fluorine, cyano, $C_{1-6}$ alkyl, tert-butyl, or $C_{1-6}$ fluoroalkyl. In embodiments $R^2$ is H, $CF_3$ or tert-butyl.

Preferably, M is Ir(III) and n is 3.

In embodiments the compound of formula (I) may be a compound according to formula (IIa) or (IIb):

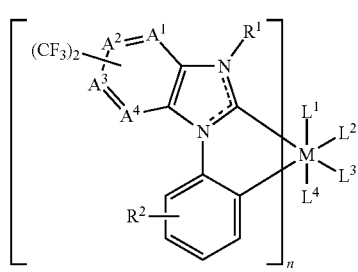

IIa

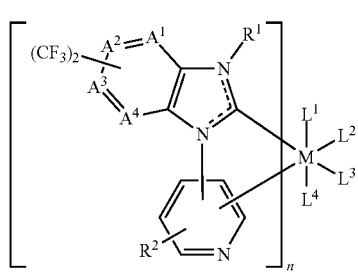

IIb

In embodiments the compound of formula (I) may be a compound according to formula (IIc) or (IId):

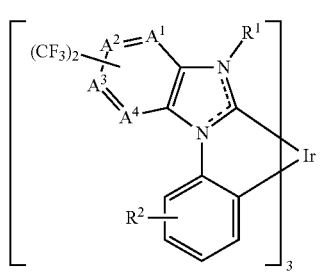
IIc

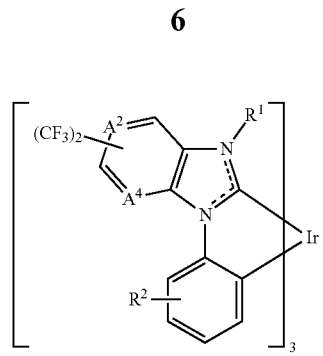
IIIc

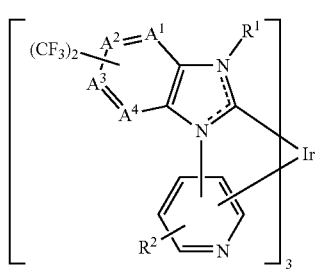
IId

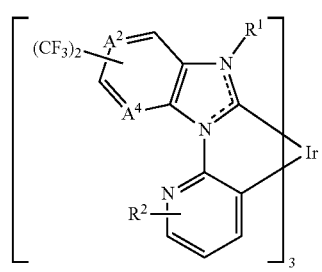
IIId wherein A² and A⁴ are each independently selected from C, CH or N, when A² and/or A⁴ are C they are substituted by the $CF_3$ groups indicated in the formula.

In embodiments the metal complex of formula (I) may be a metal complex according to formula (IIIa) or (IIIb):

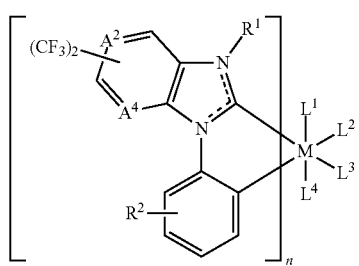
IIIa

In embodiments the metal complex of formula (I) may be a metal complex according to formula (IVa), (IVb) or (IVc):

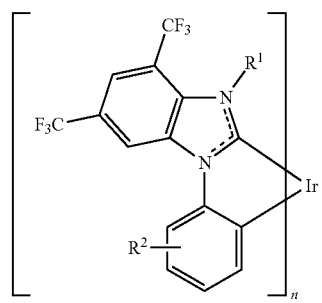
IVa

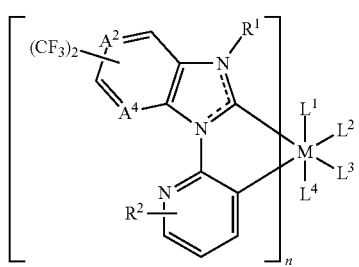
IIIb wherein A² and A⁴ are each independently selected from C, CH or N, when A² and/or A⁴ are C they are substituted by the $CF_3$ groups indicated in the formula.

In embodiments the metal complex of formula (I) may be a metal complex according to formula (IIIc) or (IIId):

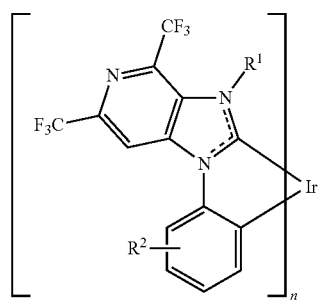
IVb

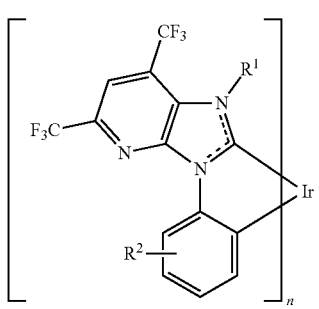
IVc
optionally n is 3.
In embodiments the metal complex of formula (I) may be a metal complex according to formula (Va), (Vb) or (Vc):
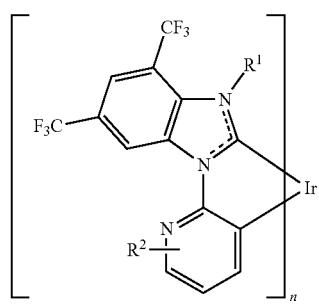
Va
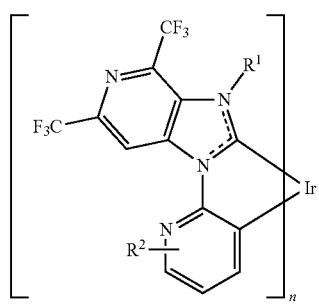
Vb
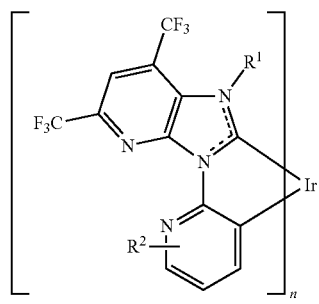
Vc
optionally n is 3.
In embodiments $R^2$ is H, deuterium, fluorine, $C_{1-6}$ alkyl or, optionally, tert-butyl.
In embodiments the metal complex of formula (I) may be a metal complex selected from:
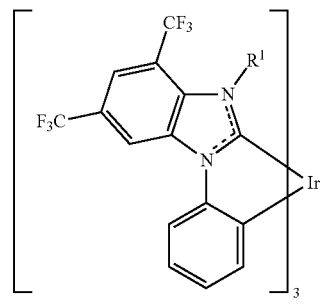
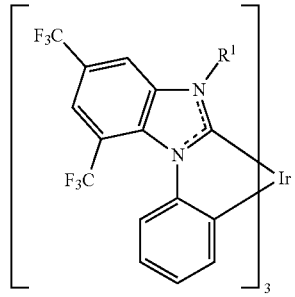
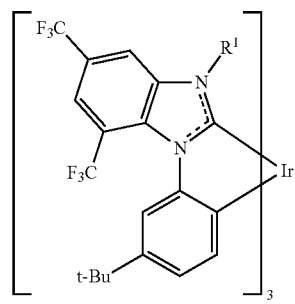
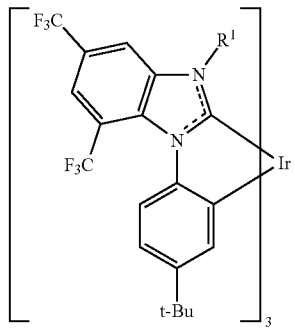
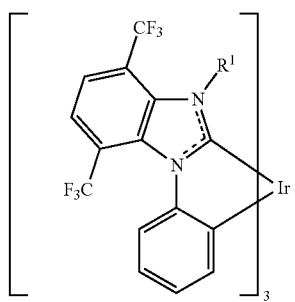

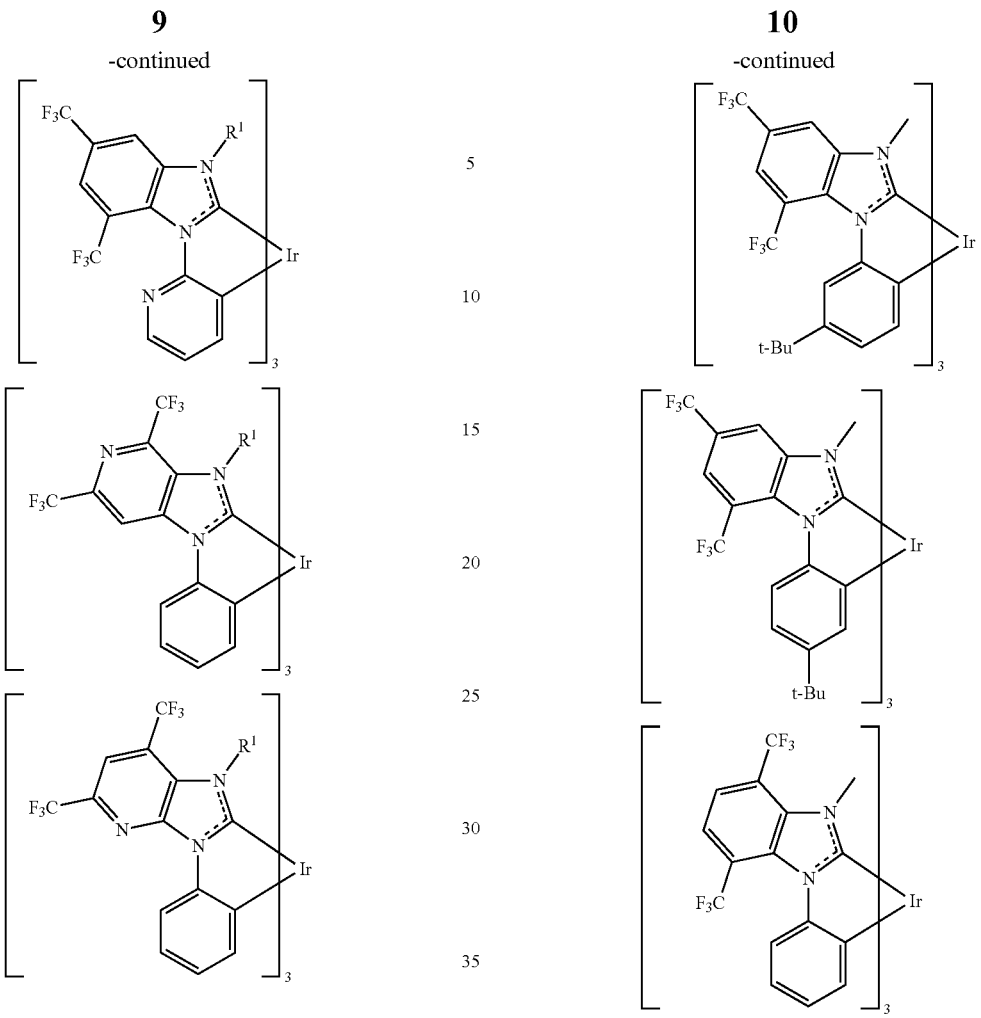
In embodiments the metal complex of formula (I) may be a metal complex selected from:
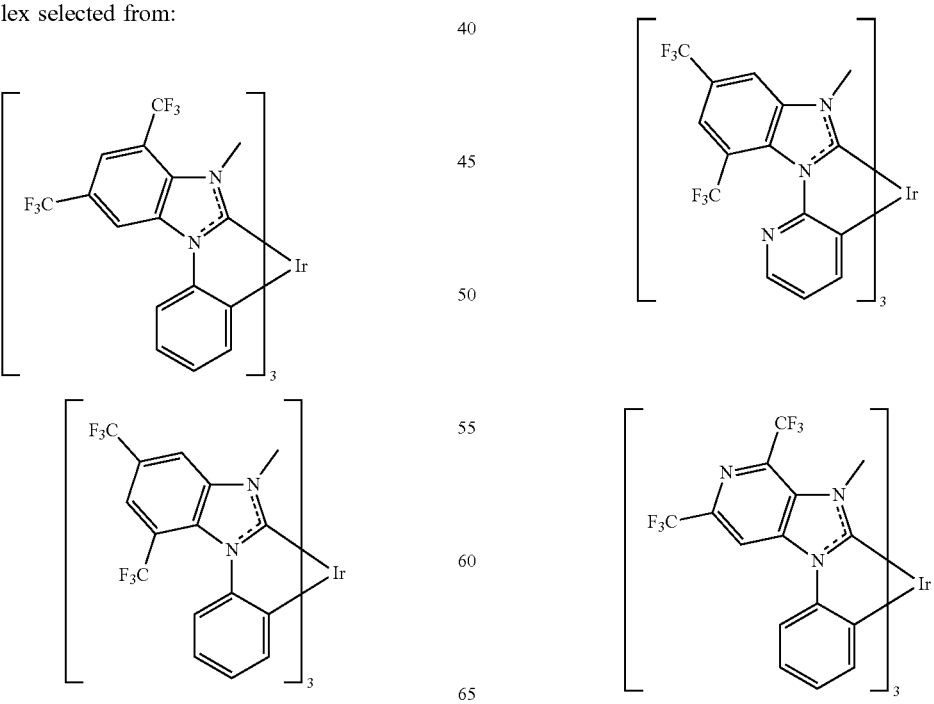

-continued

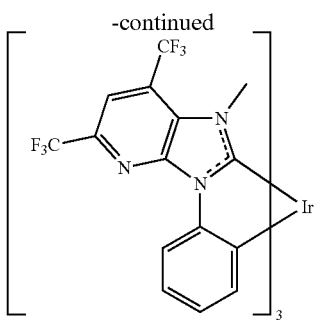

In an aspect of the present invention there is provided a metal complex disclosed herein for use in an OLED. Optionally, the metal complex of the present invention is for use in an OLED as an emitter material.

In an aspect of the present invention there is provided a metal complex disclosed herein for use in an organic electronic device. Suitable structures of the organic electronic devices are known to those skilled in the art. Preferred organic electronic devices are selected from organic light-emitting diodes (OLED), light-emitting electrochemical cells (LEEC) and organic field-effect transistors (OFET). More preferred organic electronic devices are OLEDs.

An organic light-emitting diode (OLED) is usually a light-emitting diode (LED) in which the emissive electroluminescent layer is a film of organic compound which emits light in response to an electric current. This layer of organic semiconductor is usually situated between two electrodes. Generally, at least one of these electrodes is transparent. The cyclometalated Ir complex of formula (I) may be present in any desired layer, preferably in the emissive electroluminescent layer (light-emitting layer), of the OLED as emitter material.

The present invention also contemplates in a further aspect, an OLED comprising a metal complex of the present invention.

The present invention therefore relates to an organic electronic device which is an OLED, wherein the OLED comprises
 (a) an anode,
 (b) a cathode,
 (c) a light-emitting layer between the anode and the cathode,
 (d) optionally a hole transport layer between the light-emitting layer and the anode,
 wherein the metal complex of the present invention is present in the light-emitting layer and/or, if present, in the hole transport layer of the OLED.

The OLED may be comprised in a device. Suitable devices are preferably selected from the group consisting of stationary visual display units, such as visual display units of computers, televisions, visual display units in printers, kitchen appliances, advertising panels, information panels and illuminations; mobile visual display units such as visual display units in smartphones, cell-phones, tablet computers, laptops, digital cameras, MP3-players, vehicles, keyboards and destination displays on buses and trains; illumination units; units in items of clothing; units in handbags, units in accessories, units in furniture and units in wallpaper. The present invention therefore also relates to the preceding devices comprising an OLED comprising a metal complex of the present invention.

DETAILED DESCRIPTION

The $L^1$, $L^2$, $L^3$ and $L^4$ groups are absent or present dependent on the value of the integer n and the number of co-ordinate sites on M. The number of co-ordinate sites may be affected by the inherent nature of M. For example, where M possesses a six co-ordination geometry (such as for iridium(III) and rhodium(III)) when n is 1, $L^1$, $L^2$, $L^3$ and $L^4$ are all present; when n is 2, two of $L^1$, $L^2$, $L^3$ and $L^4$ are absent and when n is 3 all of $L^1$, $L^2$, $L^3$ and $L^4$ are absent. Where M has a four co-ordination geometry (such as for platinum(II), palladium(II) and gold(III)) when n is 1 two of $L^1$, $L^2$, $L^3$ and $L^4$ are absent and when n is 2 all of $L^1$, $L^2$, $L^3$ and $L^4$ are absent.

In embodiments M is selected from Ir(III) and n is 1, 2 or 3; Rh(III) and n is 1, 2, or 3; or Pt(II), Pd(II) and Au(III) and n is 1 or 2.

In the case of metal complexes of the present invention the metal complex consists of a Iridium(III) metal centre chelated with three bidentate ligands, as represented in the formula provided herein. As will be known by the skilled person the ligands occupy an octahedral arrangement around the iridium(III) metal centre. The three ligands of the same type can occupy either the corners of one face of the octahedron (facial isomer (fac isomer)) or a meridian, i.e. two of the three ligand bonding points are in trans positions relative to one another (meridional isomer (mer isomer)).

The metal complex of the present invention may be either the mer- or fac-isomer of the compound. The metal complex may be predominantly or exclusively a single isomer or it may be a mixture of isomers. Where the metal complex is a mixture of isomers, it may be any mixture.

According to the present invention, the metal complexes of the present invention are employed in an OLED. More preferably, the cyclometalated Ir complexes of formula (I) are employed as an emitter material, preferably as an emitter material in the light-emitting layer of an OLED. Suitable OLEDs are known in the art.

The metal complex of the present invention or the mixture of emitter materials mentioned above may be comprised in the light-emitting layer of an OLED. The metal complex may be the light-emitting layer without further additional components or the metal complex may be comprised in the light-emitting layer with one or more further components. For example, a fluorescent dye may be present in the light-emitting layer of an OLED in order to alter the emission colour of the emitter material. However, the present invention may beneficially avoid the need to include a dye as it provides a blue emission. In addition, the light-emitting layer may further comprise one or more host (matrix) materials. This host material may be a polymer, for example poly(N-vinylcarbazole). The host material may, however, likewise be a small molecule with enlarged HOMO/LUMO energy gap and relatively greater triplet energy gap or tertiary aromatic amines, for example TCTA.

Suitable host materials are carbazole derivatives, for example 4,4'-bis(carbazol-9-yl)-2,2'-dimethylbiphenyl (CDBP), 4,4'-bis(carbazol-9-yl) biphenyl (CBP), 1,3-bis(N-carbazolyl)benzene (mCP), 3,3'-di(9H-carbazol-9-yl)-1,1'-biphenyl (mCBP), diphenyl[4-(triphenylsilyl)phenyl]phosphine oxide (TSPO1), and 1-(4-(dibenzo[b,d]thiophen-4-yl)-2,5-dimethylphenyl)-1H-phenanthro[9,10-d]imidazole (tx1).

The layer sequence in the inventive OLED is preferably as follows:
 1. anode (a)
 2. hole-injection layer (optionally) (b)
 3. hole-transporting layer (optionally) (c)
 4. electron/exciton-blocking layer (optionally) (d)
 5. light-emitting layer (e)
 6. hole/exciton-blocking layer (optionally) (f)

7. electron-transporting layer (optionally) (g)
8. electron-injection layer (optionally) (h)
9. cathode (i)

Layer sequences different from the aforementioned construction are also possible, and are known to those skilled in the art.

In general, the different layers in the inventive OLED, if present, have the following thicknesses:
- anode (a): 50 to 500 nm, preferably 100 to 200 nm;
- hole-injection layer (optionally) (b): 1 to 50 nm, preferably 5 to 10 nm;
- hole-transporting layer (optionally) (c): 5 to 100 nm, preferably 10 to 80 nm;
- electron/exciton blocking layer (optionally) (d): 1 to 50 nm, preferably 5 to 10 nm;
- light-emitting layer (e): 1 to 100 nm, preferably 5 to 60 nm;
- hole/exciton-blocking layer (optionally) (f): 1 to 50 nm, preferably 5 to 10 nm;
- electron-transporting layer (optionally) (g): 5 to 100 nm, preferably 20 to 60 nm;
- electron-injection layer (optionally) (h): 1 to 20 nm, preferably 1 to 5 nm;
- cathode (i): 20 to 1000 nm, preferably 30 to 500 nm.

EXAMPLES

Synthesis of the Metal Complexes

Synthesis Example 1. Synthesis of Complex mer-lfac-Ir(dfpmb)₃ a) Synthesis of 2-Bromo-3,5-bis(trifluoromethyl)aniline

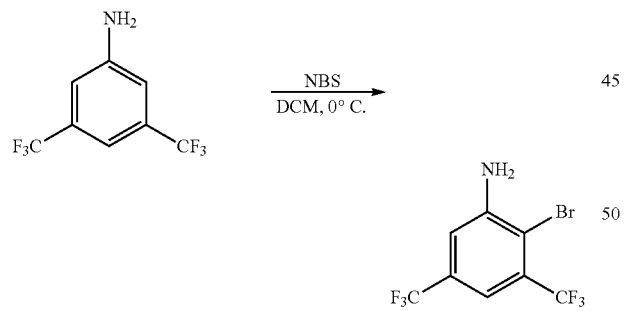

A solution of 3,5-bis(trifluoromethyl) aniline (11.46 g, 50 mmol) in 50 mL DCM was cooled to 0° C. followed by dropwise addition of a solution of N-bromosuccinimide (8.90 g, 50 mmol) in 340 mL of CH₂Cl₂ while maintaining the temperature below 5° C. The reaction was monitored by TLC. After the reaction was completed, the reaction mixture was washed with a saturated aqueous solution of NaHCO₃ (2×100 mL) and water (100 mL). The organic phase was dried over Na₂SO₄ and the solvent was evaporated under reduced pressure. The crude product was purified by column chromatography on silica gel using petroleum ether/DCM (4:1, v/v) as eluent to give off-white needles. Yield: 12.5 g (81.2%). 1H NMR (300 MHZ, CDCl₃) δ 7.28 (d, J=1.6 Hz, 1H), 7.14 (d, J=1.8 Hz, 1H), 4.60 (s, 2H).

b) Synthesis of 1-Phenyl-5,7-bis(trifluoromethyl)-1H-benzo[d]imidazole

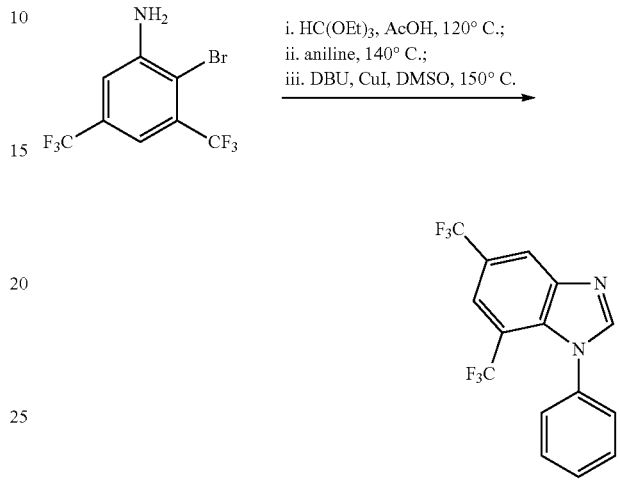

The mixture of 2-Bromo-3,5-bis(trifluoromethyl) aniline (3.08 g, 10 mmol), triethyl orthoformate (1.48 g, 1.66 mL, 10 mmol) and glacial acetic acid (30 mg, 29 μL, 0.5 mmol) was stirred for 4 h at 120° C., then cooled to R.T. aniline (3.3 g, 10 mmol) was added and the resulting mixture was stirred for 12 h at 140° C. After cooled to R.T., DBU (1.52 g, 1.5 mL, 10 mmol), CuI (190 mg, 1.0 mmol) and DMSO (20 mL) were added and the reaction mixture was stirred overnight at 150° C. After the reaction was completed, ethyl acetate (50 mL) was added, to which the mixture was filtered through a Celite pad. The filtrate was washed with brine and water in sequence and dried over anhydrous Na₂SO₄ and, then, concentrated by rotatory evaporation. The crude product was purified by column chromatography using petroleum ether/ethyl acetate (4/1, v/v) as eluent to give a gray solid. Yield: 1.49 g (45.2%). 1H NMR (400 MHZ, CDCl₃) δ 8.41 (s, 1H), 8.16 (s, 1H), 7.87 (s, 1H), 7.57 (d, J=7.7 Hz, 3H), 7.42 (d, J=6.3 Hz, 2H).

c) Synthesis of 3-Methyl-1-phenyl-5,7-bis(trifluoromethyl)-1H-benzo[d]imidazol-3-ium trifluoromethanesulfonate

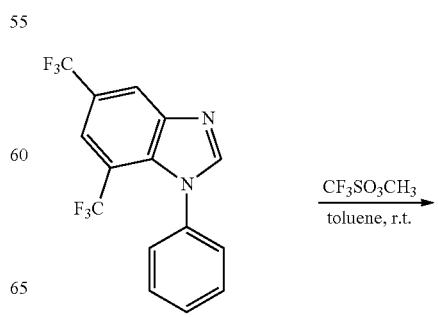

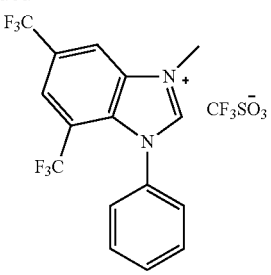

Compound 1-Phenyl-5,7-bis(trifluoromethyl)-1H-benzo[d]imidazole (1.16 g, 3.5 mmol) was dissolved in anhydrous toluene (40 mL) at R.T. and, methyl trifluoromethanesulfonate (1.72 g, 1.19 mL, 10.5 mmol) was added dropwise and the reaction mixture was stirred for 4 h. The resulting precipitate was filtered off, washed with toluene, and dried overnight under vacuum to provide a colorless solid. Yield: 1.65 g (95.1%). 1H NMR (300 MHZ, DMSO) δ 10.35 (s, 1H), 9.15 (s, 1H), 8.43 (s, 1H), 7.79-7.66 (m, 5H), 4.28 (s, 3H).

d) Synthesis of mer-1fac-Ir(dfpmb)$_3$

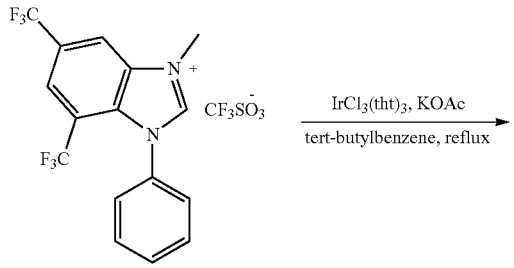

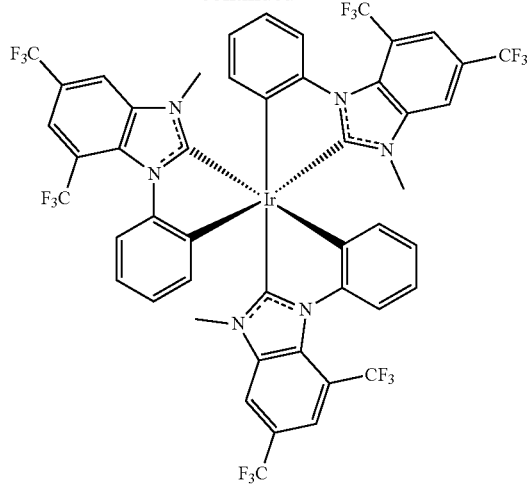

Under N$_2$ atmosphere, a mixture of 3-Methyl-1-phenyl-5,7-bis(trifluoromethyl)-1H-benzo[d]imidazol-3-ium trifluoromethanesulfonate (1.63 g, 3.3 mmol), Ir(tht)$_3$Cl$_3$ (563 mg, 1.0 mmol) and NaOAc (492 mg, 6.0 mmol) in 50 mL degassed ter.t.-butylbenzene was refluxed at 170° C. for 12 h to give a light-yellow suspension. After cooled to room temperature, the reaction mixture was filtered through a pad of celite and, then the filtrate was removed under reduced pressure. Light yellow mer-Ir(dfpmb)$_3$ and fac-Ir(dfpmb)$_3$ was obtained via flash chromatography using hexane/ethyl acetate (5/1, v/v) as eluent.

mer-Ir(dfpmb)$_3$, light yellow solid (553 mg, 45.3%). 1H NMR (400 MHZ, acetone-d$_6$) δ 8.20 (s, 2H), 8.13 (s, 1H), 8.03 (s, 1H), 7.97 (s, 1H), 7.94 (s, 1H), 7.64 (d, J=8.1 Hz, 1H), 7.61-7.53 (m, 2H), 6.95-6.79 (m, 5H), 6.62 (tt, J=15.6, 7.6 Hz, 4H), 3.72 (s, 3H), 3.70 (s, 3H), 3.57 (s, 3H); $^{19}$F NMR (376 MHZ, acetone-d$_6$) δ −53.00 (s, 3F), −53.07 (s, 3F), −53.21 (s, 3F), −61.71 (s, 3F), −61.73 (s, 3F), −61.74 (s, 3F).

fac-Ir(dfpmb)$_3$, light yellow solid (349 mg, 28.6%). 1H NMR (400 MHZ, acetone-d$_6$) δ 8.15 (s, 3H), 8.00 (s, 3H), 7.64 (d, J=8.0 Hz, 3H), 6.97-6.90 (m, 3H), 6.61 (d, J=4.2 Hz, 6H), 3.62 (s, 9H); $^{19}$F NMR (376 MHZ, acetone-d$_6$) δ −53.08 (s, 9F), −61.74 (s, 9F).

Synthesis Example 2. Synthesis of Complex mer-1fac-Ir(dfpmp)$_3$ a) Synthesis of 2,6-bis(trifluoromethyl)-2,6-dihydroxytetrahydropyran-4-one

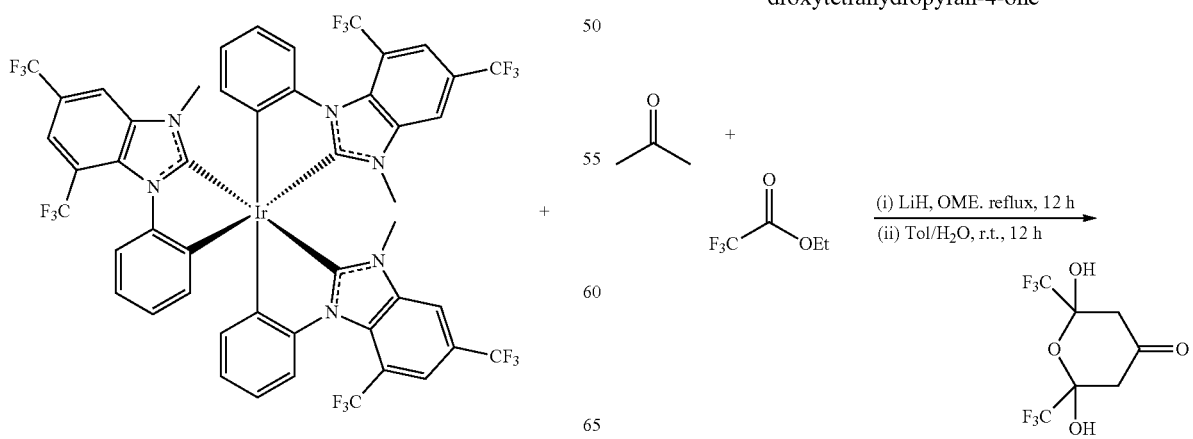

The procedure was adapted from the previously reported literature (*Angew. Chem. Int. Ed.* 2011, 50, 10703-10707) to give the desired product as a white solid (24 g, 45%). 1H NMR (300 MHZ, acetone-d$_6$) δ/ppm 7.41 (d, J=3 Hz, 2H), 3.19 (d, J=15 Hz, 2H), 2.76 (d, J=15 Hz, 2H); $^{19}$F NMR (376 MHZ, acetone-d$_6$) δ/ppm-86.23 (s, 6F).

b) Synthesis of 2,6-bis(trifluoromethyl) pyridin-4-ol

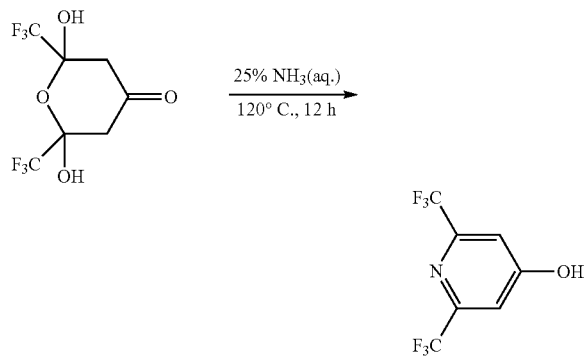

In a sealed tube, compound 2,6-bis(trifluoromethyl)-2,6-dihydroxytetrahydropyran-4-one (10 g, 37.3 mmol) was mixed with 50 mL of 25% aqueous ammonia and heated with stirring at a temperature of about 120° C. for 12 h. After cooling to room temperature, a large quality of white crystal was filtered. Dissolution of this white crystal in water was accomplished by the addition of sufficient of saturated NaOH solution. Subsequent acidification of the solution with 2 M HCl (aq.) and cooling at 0° C. gave white precipitate, which was filtered off and dried under vacuum to furnish product as a white solid (7.6 g, 89%). $^1$H NMR (400 MHZ, acetone-d$_6$) δ/ppm 11.07 (br, 1H), 7.50 (s, 2H); $^{19}$F NMR (376 MHZ, acetone-d$_6$) δ/ppm-69.02 (s, 6F).

c) Synthesis of 3-nitro-2,6-bis(trifluoromethyl) pyridin-4 (1H)-one

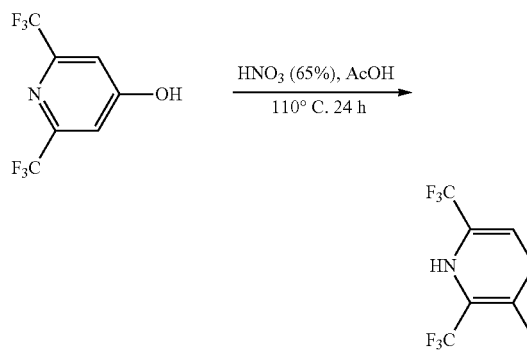

Nitric acid (12.0 mL, 172.8 mmol, 65% aqueous solution) was added dropwise into 30 mL of CH$_3$COOH in an ice bath. To this mixture, compound 2,6-bis(trifluoromethyl) pyridin-4-ol (5.0 g, 21.6 mmol) was added in portions with vigorous stirring. The resultant mixture was heated to 110° C. for 24 h. Half of the CH$_3$COOH was removed by distillation in vacuo and the residue was poured onto ice water (100 mL), and then extracted with ethyl acetate (80 mL). The organic layer was washed with water and dried over anhydrous MgSO$_4$. Thereafter, the solvent was removed in vacuo and the resulting crude product was further purified via silica gel column chromatography using hexane/ethyl acetate (5/1, v/v) as the eluent to afford 3 a light-yellow solid (4.8 g, 80%). $^1$H NMR (400 MHZ, DMSO-d$_6$) δ/ppm 7.49 (s, 1H), 5.98 (br, 1H); $^{19}$F NMR (376 MHZ, DMSO-d$_6$) δ/ppm-64.85 (s, 3F), 67.49 (s, 3F).

d) Synthesis of 4-chloro-3-nitro-2,6-bis(trifluoromethyl)pyridine

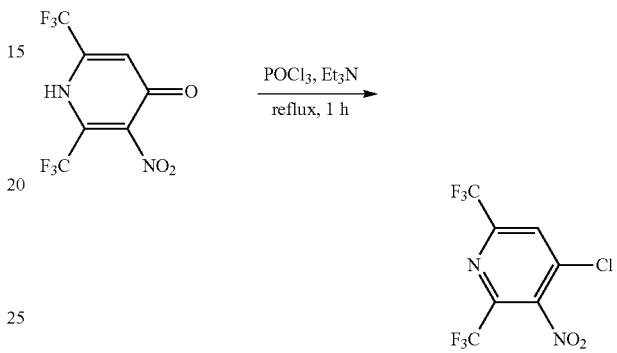

Triethylamine (1.1 g, 10.9 mmol) was added dropwise into a mixture of 3-nitro-2,6-bis(trifluoromethyl) pyridin-4 (1H)-one (3.0 g, 10.9 mmol) and POCl$_3$ (5.0 mL, 54.5 mmol) at 0° C. The resulted white suspension was stirred and heated at 125° C. for 1 h forming a clear, colorless solution. Excess POCl$_3$ was distilled off under vacuum and the residue was poured into a separatory funnel containing ethyl acetate (50 mL) and washed with ice water (100×3 mL) three times. The organic layer was dried over anhydrous Na$_2$SO$_4$, filtered and concentrated in vacuo to give target product as a light-yellow solid (2.6 g, 81%) $^1$H NMR (400 MHZ, CDCl$_3$) δ/ppm 8.13 (s, 1H); $^{19}$F NMR (376 MHZ, CDCl$_3$) δ/ppm-65.36 (s, 3F), 68.07 (s, 3F).

e) Synthesis of 3-nitro-N-phenyl-2,6-bis(trifluoromethyl) pyridin-4-amine

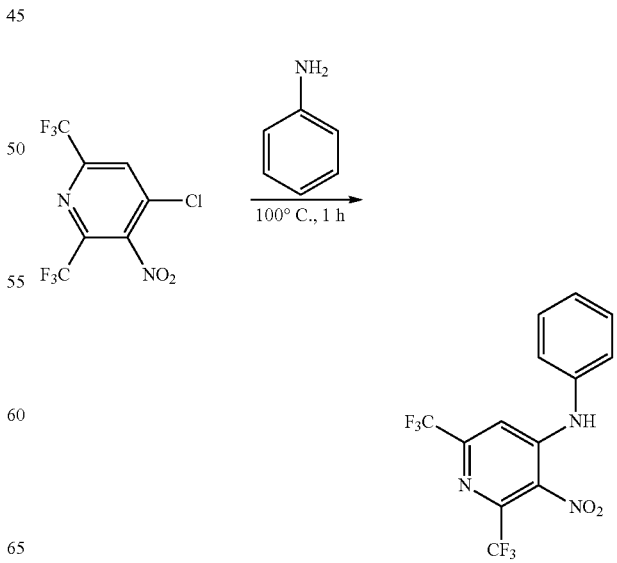

Compound 4-chloro-3-nitro-2,6-bis(trifluoromethyl)pyridine (2.6 g, 8.8 mmol), and aniline (0.8 g, 8.8 mmol) were reflux with 30 ml of 2-propanol for 1 h. Afterward, the reaction mixture was concentrated. The crude product was recrystallized from n-hexane to furnish product as a yellow crystal (2.7 g, 89%). $^1$H NMR (400 MHZ, CDCl$_3$) δ/ppm 8.04 (s, 1H), 7.53 (t, J=7.8 Hz, 2H), 7.45-7.38 (m, 2H), 7.25 (m, 2H); $^{19}$F NMR (376 MHz, CDCl$_3$) δ/ppm-64.82 (s, 3F), 68.94 (s, 3F).

f) Synthesis of N$^4$-phenyl-2,6-bis(trifluoromethyl)pyridine-3,4-diamine

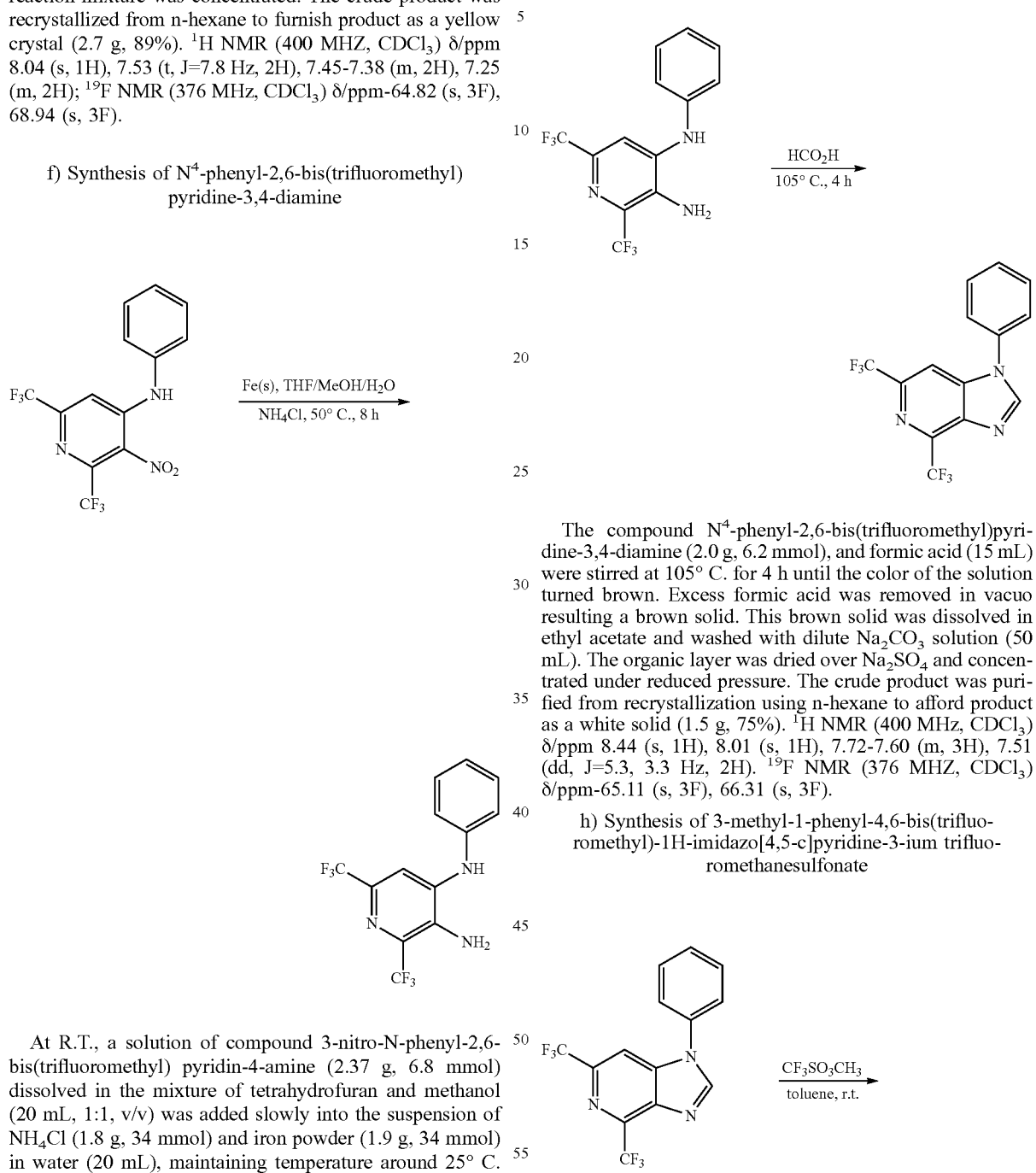

At R.T., a solution of compound 3-nitro-N-phenyl-2,6-bis(trifluoromethyl) pyridin-4-amine (2.37 g, 6.8 mmol) dissolved in the mixture of tetrahydrofuran and methanol (20 mL, 1:1, v/v) was added slowly into the suspension of NH$_4$Cl (1.8 g, 34 mmol) and iron powder (1.9 g, 34 mmol) in water (20 mL), maintaining temperature around 25° C. Under vigorous stirring, the reaction mixture was heated at 50° C. for 8 h. After cooled to R.T., the mixture was filtered through celite. Solvents was removed under reduced pressure, and the residue dissolved in ethyl acetate and washed with distilled water (100 mL). The organic layer was separated and concentrated to dryness. The crude product was recrystallized from n-hexane to furnish target product as a white powder (2.1 g, 97%). $^1$H NMR (400 MHZ, CDCl$_3$) δ/ppm 7.42 (dd, J=10.4, 5.2 Hz, 3H), 7.20 (t, J=7.5 Hz, 1H), 7.11 (d, J=7.6 Hz, 2H), 5.81 (s, 1H), 4.20 (s, 2H). $^{19}$F NMR (376 MHZ, CDCl$_3$) δ/ppm-65.11 (s, 3F), 67.23 (s, 3F).

g) Synthesis of 1-phenyl-4,6-bis(trifluoromethyl)-1H-imidazo[4,5-c]pyridine

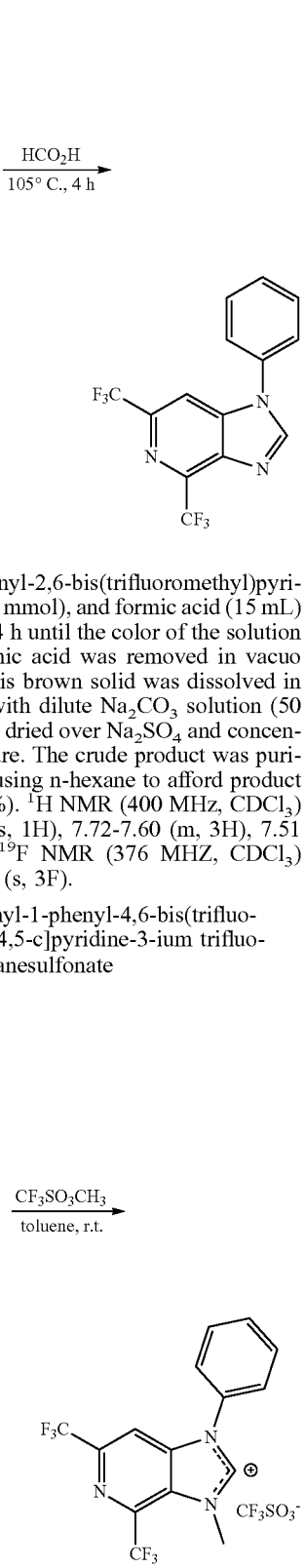

The compound N$^4$-phenyl-2,6-bis(trifluoromethyl)pyridine-3,4-diamine (2.0 g, 6.2 mmol), and formic acid (15 mL) were stirred at 105° C. for 4 h until the color of the solution turned brown. Excess formic acid was removed in vacuo resulting a brown solid. This brown solid was dissolved in ethyl acetate and washed with dilute Na$_2$CO$_3$ solution (50 mL). The organic layer was dried over Na$_2$SO$_4$ and concentrated under reduced pressure. The crude product was purified from recrystallization using n-hexane to afford product as a white solid (1.5 g, 75%). $^1$H NMR (400 MHz, CDCl$_3$) δ/ppm 8.44 (s, 1H), 8.01 (s, 1H), 7.72-7.60 (m, 3H), 7.51 (dd, J=5.3, 3.3 Hz, 2H). $^{19}$F NMR (376 MHZ, CDCl$_3$) δ/ppm-65.11 (s, 3F), 66.31 (s, 3F).

h) Synthesis of 3-methyl-1-phenyl-4,6-bis(trifluoromethyl)-1H-imidazo[4,5-c]pyridine-3-ium trifluoromethanesulfonate At R.T., 1-phenyl-4,6-bis(trifluoromethyl)-1H-imidazo[4,5-c]pyridine (0.5 g, 1.5 mmol) was dissolved in 30 mL toluene, methyl trifluoromethanesulfonate (0.2 mL, 1.8 mmol) was added dropwise and, then the reaction mixture was vigorously stirred for another 12 h. The resulted white precipitate was filtered and used for the next step without further purification (0.6 g, 80%). $^1$H NM R (400 MHZ, CDCl$_3$) δ/ppm 10.52 (s, 1H), 8.83 (s, 1H), 8.01-7.94 (m, 2H), 7.85-7.79 (m, 3H), 4.58 (d, J=1.7 Hz, 3H). $^{19}$F NMR (376 MHZ, CDCl$_3$) δ/ppm-61.63 (d, J=1.7 Hz), −67.42 (s), −79.13 (s).

i) Synthesis of mer-1fac-Ir(dfpmp)$_3$

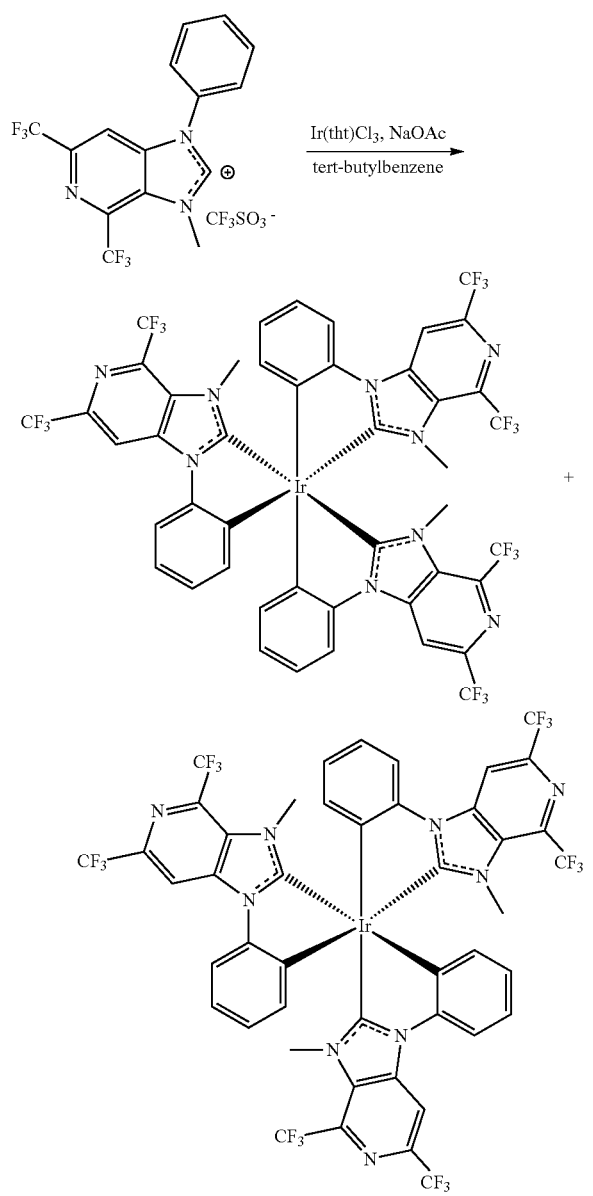

Under N$_2$ atmosphere, a mixture of compound 3-methyl-1-phenyl-4,6-bis(trifluoromethyl)-1H-imidazo[4,5-c]pyridine-3-ium trifluoromethanesulfonate (0.3 g, 0.6 mmol), Ir(tht)$_3$Cl$_3$ (120 mg, 0.2 mmol) and NaOAc (49 mg, 0.6 mmol) in 20 mL degassed tert-butylbenzene was refluxed at 140° C. for 12 h to give a light-yellow suspension. After cooled to room temperature, the reaction mixture was filtered through a pad of celite and, then the filtrate was removed under reduced pressure. Light yellow mer-Ir (dfpmp)$_3$ and fac-Ir(dfpmp)$_3$ was obtained via flash chromatography using hexane/ethyl acetate (5/1, v/v) as eluent.

mer-Ir(dfpmp)$_3$, light yellow solid (147 mg, 60%). $^1$H NMR (400 MHZ, acetone-d$_6$) δ/ppm 9.13 (s, 1H), 9.10 (s, 1H), 9.06 (s, 1H), 8.22 (dd, J=8.0, 1.7 Hz, 2H), 8.17 (d, J=8.0 Hz, 1H), 7.12-7.01 (m, 3H), 6.99 (dd, J=7.2, 1.3 Hz, 1H), 6.81-6.67 (m, 5H), 3.80 (d, J=1.8 Hz, 3H), 3.72 (d, J=2.0 Hz, 3H), 3.53 (d, J=2.0 Hz, 3H). $^{19}$F NMR (376 MHZ, acetone-d$_6$) δ/ppm-59.48 (d, J=2.0 Hz, 3F), −59.56 (d, J=2.0 Hz, 3F), −59.69 (d, J=1.8 Hz, 3F), −66.73 (s, 9F).

fac-Ir(dfpmp)$_3$, light yellow solid (61 mg, 25%). 1H NMR (400 MHZ, acetone-de) δ/ppm 9.07 (s, 3H), 8.22 (d, J=8.0 Hz, 3H), 7.16-7.06 (m, 3H), 6.70 (t, J=7.3 Hz, 3H), 6.49 (dd, J=7.4, 1.1 Hz, 3H), 3.85 (d, J=1.8 Hz, 9H). $^{19}$F NMR (376 MHZ, acetone-d$_6$) δ/ppm-59.59 (d, J=1.8 Hz), −66.71 (s).

N-heterocyclic carbene (NHC) based ligands have higher triplet energy, increased thermodynamic stability, and enlarged ligand field stabilization energy in comparison to the conventional N-heteroaromatic cyclometalate chelates. The following disclosure demonstrates that NHC-based Ir(III) metal complexes are excellent candidates for efficient and robust blue-emitting OLEDs.

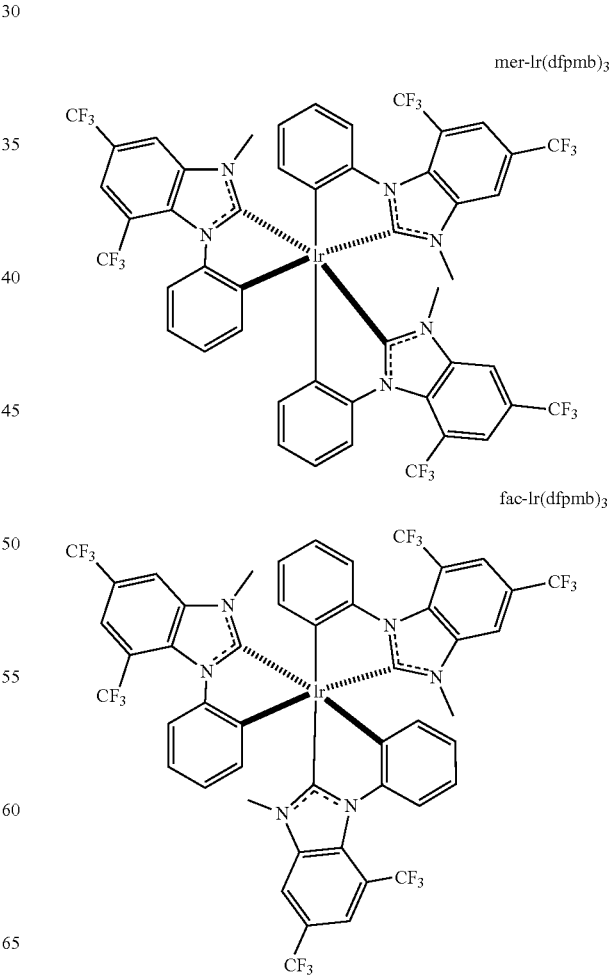

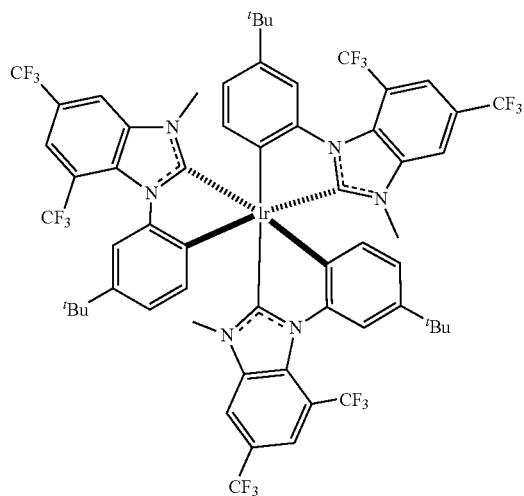

fac-Ir(3-bdfpmb)₃

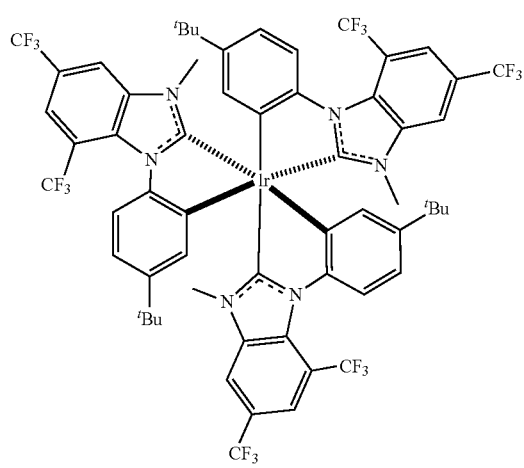

fac-Ir(4-bdfpmb)₃

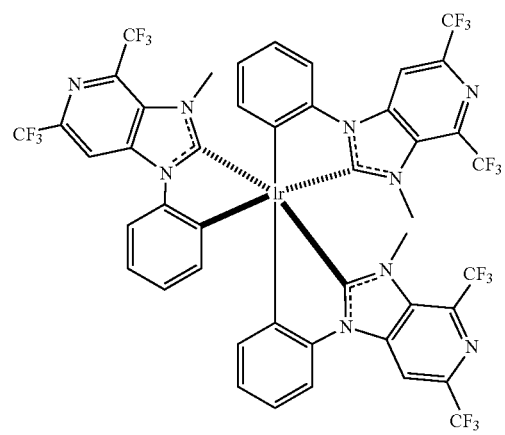

mer-Ir(dfpmp)₃

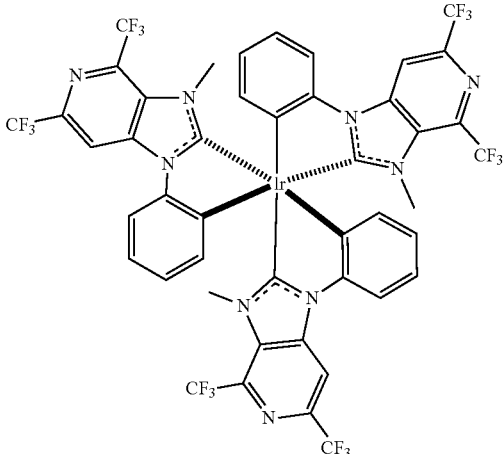

fac-Ir(dfpmp)₃

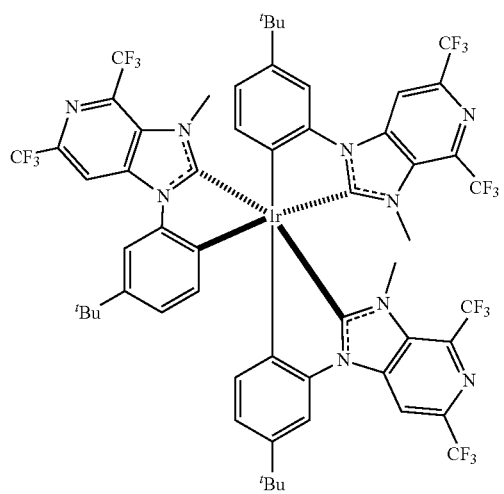

mer-Ir(3-bdfpmp)₃

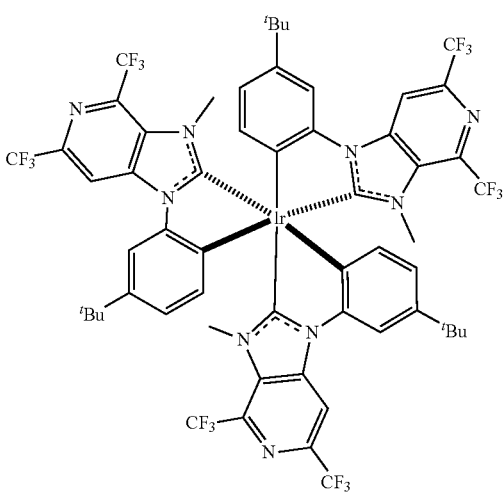

fac-Ir(3-bdfpmp)₃

The photophysical properties of eight NHC-Ir(III) complexes of the present invention, shown above, were investigated. The photophysical properties were compared to two comparative compounds mer-Ir(pmb)₃ and fac-Ir(pmb)₃. The results of the experiments are shown in Table 1a and Table 1b.

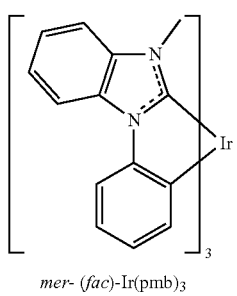

mer- (fac)-Ir(pmb)₃

TABLE 1a

Photophysical data of the representative tris-bidentate, NHC-based Ir(III) complexes and their parent compounds mer-Ir(pmb)₃ and fac-Ir(pmb)₃.

| | $\lambda_{max}$ (nm) | FWHM (cm⁻¹) | Φ (%) | $T_{obs}$ (μs) | $T_{rad}$ (μs) |
|---|---|---|---|---|---|
| mer-Ir(pmb)₃ | 395 | — | 0.2 | 0.015 | — |
| fac-Ir(pmb)₃ | 389 | — | 4 | 0.22 | — |
| mer-Ir(dfpmb)₃ | 499 | 4345 | 41 | 0.68 | 1.66 |
| fac-Ir(dfpmb)₃ | 466 | 3947 | 59 | 1.14 | 1.94 |
| fac-Ir(3-bdfpmb)₃ | 478 | 3898 | 70 | 0.96 | 1.37 |
| fac-Ir(4-bdfpmb)₃ | 474 | 3820 | 68 | 1.2 | 1.77 |
| mer-Ir(dfpmp)₃ | 501 | 4623 | 43 | 0.32 | 0.74 |
| fac-Ir(dfpmp)₃ | 443 | 4430 | 70 | 0.39 | 0.58 |
| mer-Ir(3-bdfpmp)₃ | 512 | 4174 | 48 | 0.57 | 1.19 |
| fac-Ir(3-bdfpmp)₃ | 462 | 3486 | 74 | 0.74 | 1.00 |

TABLE 1b

Photophysical and electrochemical data of the representative tris-bidentate, NHC-based Ir(III) complexes and their parent compounds mer-Ir(pmb)₃ and fac-Ir(pmb)₃.

| | $k_r$ (10⁵ s⁻¹) | $k_{nr}$ (10⁵ s⁻¹) | $E_{HOMO}$ (eV) | $E_{LUMO}$ (eV) |
|---|---|---|---|---|
| mer-Ir(pmb)₃ | 1.3 | 665 | -4.8 | -1.4 |
| fac-Ir(pmb)₃ | 1.8 | 44 | -5.1 | -1.8 |
| mer-Ir(dfpmb)₃ | 6.03 | 8.68 | -5.12 | -2.48 |
| fac-Ir(dfpmb)₃ | 5.16 | 3.58 | -5.45 | -2.49 |
| fac-Ir(3-bdfpmb)₃ | 7.31 | 3.13 | -5.33 | -2.45 |
| fac-Ir(4-bdfpmb)₃ | 5.65 | 2.66 | -5.35- | -2.44 |
| mer-Ir(dfpmp)₃ | 13 | 17 | -5.33 | -2.73 |
| fac-Ir(dfpmp)₃ | 18 | 7.6 | -5.65 | -2.75 |
| mer-Ir(3-bdfpmp)₃ | 8.4 | 9.2 | -5.26 | -2.74 |
| fac-Ir(3-bdfpmp)₃ | 10 | 3.5 | -5.54 | -2.75 |

Notes:
All data for parent compounds are quoted according to the original reference. PL spectra, lifetime, and quantum yield of eight proposed complexes were recorded in doped PMMA thin film at RT (2 wt. %). The FMO energy levels of these compounds are calculated from the following equations: $E_{HOMO} = -(E_{ox}^{onset} + 4.8)$ eV, $E_{LUMO} = -(E_{red}^{onset} + 4.8)$ eV, where $E_{ox}^{onset}$ and $E_{red}^{onset}$ are measured in CH₃CN solution and reported versus the Fc/Fc⁺ couple.

The results clearly demonstrate that the Ir(III) complexes of this invention exhibit a genuine blue emission, higher emission quantum yield, shorter radiative lifetime, and downward shifted LUMO energy levels than the parent compounds such as mer-Ir(pmb)₃ and fac-Ir(pmb)₃. These results may indicate a possible method of achieving efficient and robust blue phosphors and respective PHOLEDs.

The dual trifluoromethyl substituents at the benzimidazolylidene/pyridoimidazolylidene site of the present inventive bidentate NHC-based chelates may result in the downward shifting of both the highest occupied molecular orbitals (HOMO) and lowest unoccupied molecular orbitals (LUMO), particular the latter, needed efficient blue emission and, finally, a considerably shortened radiative lifetime of approximately one microsecond or less. These characteristics are of particular importance as shorter the radiative lifetime, the less is the emission quenching that would occur at the higher driving voltages. In addition, the faster radiative decay may also improve the stability of the emitters due to the reduced residence time at the highly energized excited state manifolds. Furthermore, the downward shifted HOMO and LUMO levels are conducive to effective charge carrier transport and recombination when used in devices fabrication and, thereby, giving excellent device performances.

The invention claimed is:

1. A metal complex according to formula (I):

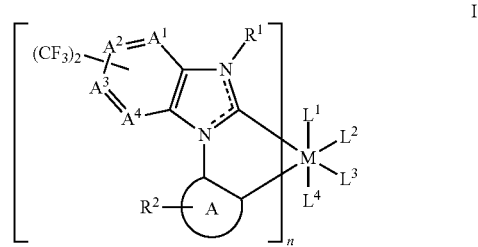

wherein:
M is a transition metal;
n is selected from 1, 2 or 3; $L^1$, $L^2$, $L^3$ and $L^4$ each independently represent an optionally present monodentate ligand or two adjacent $L^1$, $L^2$, $L^3$ and $L^4$ may represent an optionally present bidentate ligand around the central transition-metal cation;
A represents a $C_{6-10}$ aryl ring or a 5 to 10 membered heteroaryl ring;
two of $A^1$, $A^2$, $A^3$ and $A^4$ are C and are substituted by the strong electron withdrawing $CF_3$ groups indicated in the formula and the remaining two of $A^1$, $A^2$, $A^3$ and $A^4$ may be independently selected from CH or N;
$R^1$ is selected from the group consisting of: $C_{1-6}$ alkyl, $C_{2-6}$ alkylether, $C_{1-6}$ alkoxy, $C_{1-6}$ fluoroalkyl, $C_{2-6}$ alkenyl, $C_{2-6}$ alkynyl, substituted or unsubstituted $C_{3-8}$ cycloalkyl, substituted or unsubstituted $C_{3-8}$ cycloalkenyl, substituted or unsubstituted 3 to 8 membered heterocycloalkyl, substituted or unsubstituted 3 to 8 membered heterocycloalkenyl, substituted or unsubstituted $C_{7-10}$ aryl, substituted or unsubstituted $C_{7-11}$ aralkyl, substituted or unsubstituted heteroaryl having 5 to 10 carbon atoms and/or heteroatoms, and substituted or unsubstituted heteroaralkyl having 6 to 11 carbon atoms and/or heteroatoms; and
$R^2$ is H, deuterium, cyano, fluorine, $C_{1-6}$ alkyl, $C_{1-6}$ alkoxy, $C_{1-6}$ fluoroalkyl, substituted or unsubstituted $C_{6-10}$ aryl, or substituted or unsubstituted heteroaryl having 5 to 10 carbon atoms and/or heteroatoms.

2. The metal complex of claim 1, wherein M is selected from iridium, rhodium, platinum, palladium, gold, osmium and ruthenium.

3. The metal complex of claim 1, wherein M is iridium.

4. The metal complex of claim 1, wherein A represents a phenyl ring or a pyridyl ring.

5. The metal complex of claim 1, wherein $A^1$ and $A^3$ are each independently selected from C or CH and $A^2$ and $A^4$ are each independently selected from C, CH or N, provided that two of $A^1$, $A^2$, $A^3$ and/or $A^4$ are C and they are substituted by the $CF_3$ groups indicated in the formula.

6. The metal complex of claim 1, wherein the metal complex is a metal complex according to formula (IIIa) or (IIIb):

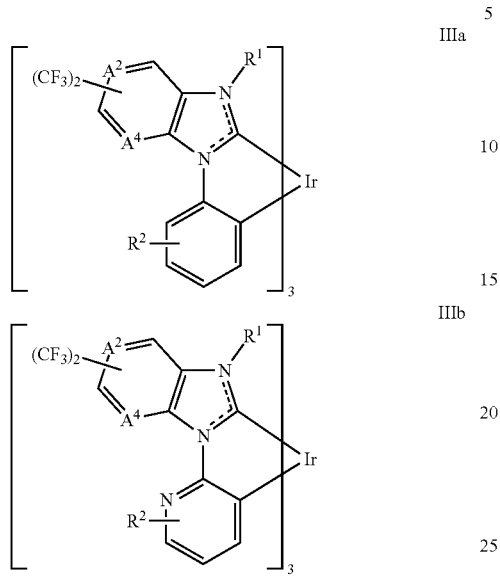

wherein $A^2$ and $A^4$ are each independently selected from C, CH or N, when $A^2$ and/or $A^4$ are C they are substituted by the $CF_3$ groups indicated in the formula.

7. The metal complex of claim 1, wherein $R^1$ is selected from the group consisting of: $C_{1-6}$ alkyl, $C_{2-6}$ alkylether, $C_{1-6}$ alkoxy, $C_{1-6}$ fluoroalkyl, substituted or unsubstituted $C_{7-11}$ aralkyl, and substituted or unsubstituted $C_{7-10}$ aryl.

8. The metal complex of claim 1, wherein $R^1$ is selected from the group consisting of: methyl, ethyl, propyl, butyl, and tert-butyl.

9. The metal complex of claim 1, wherein $R^2$ is H, deuterium, fluorine, methyl, trifluoromethyl, tert-butyl, phenyl, or benzyl.

10. The metal complex of claim 1, wherein the metal complex is selected from:

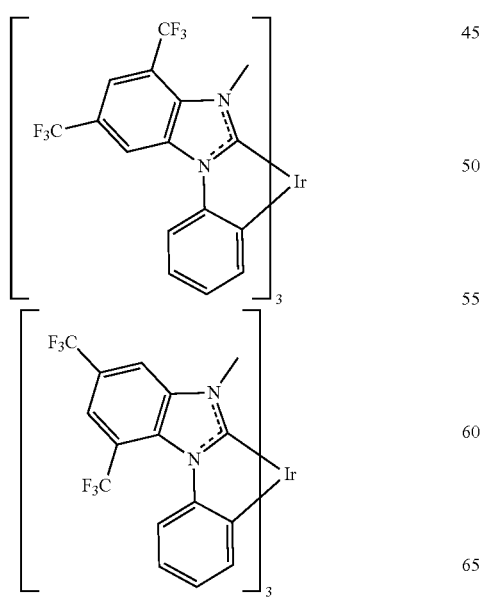

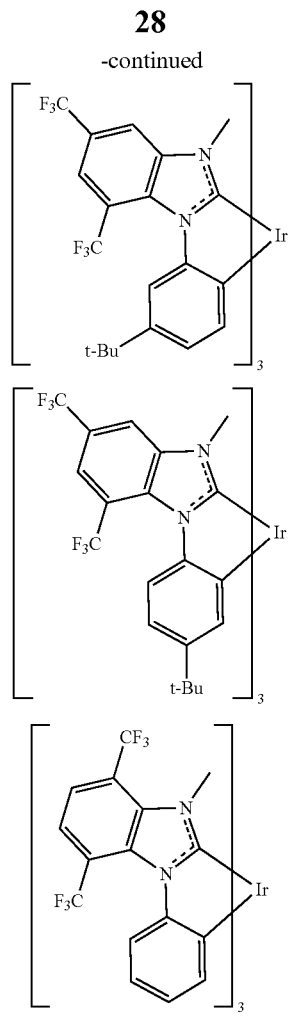

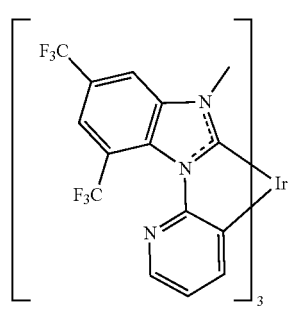

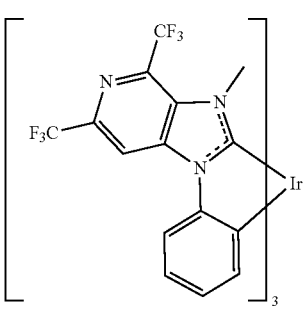

-continued

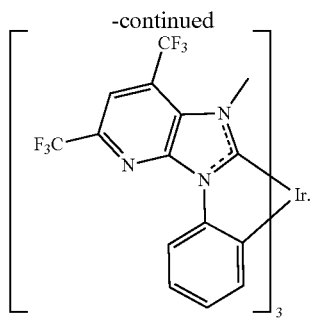

11. The metal complex of claim 1, wherein the metal complex is for use in an organic light-emitting diode.

12. The metal complex of claim 11, wherein the metal complex is for use as an emitter in the organic light-emitting diode.

13. An organic light-emitting diode comprising:
(a) an anode,
(b) optionally a hole-injection layer,
(c) optionally a hole-transporting layer,
(d) optionally an electron/exciton-blocking layer,
(e) a cathode,
(f) a light-emitting layer between the anode and the cathode, wherein the light emitting layer comprises the metal complex of claim 1,
(g) optionally a hole/exciton-blocking layer,
(h) optionally an electron-transporting layer, and
(i) optionally an electron-injection layer.

14. The metal complex of claim 8, wherein the butyl is tert-butyl.

* * * * *